United States Patent [19]
Sheffield et al.

[11] Patent Number: 5,793,669
[45] Date of Patent: Aug. 11, 1998

[54] HIGH DENSITY TWO PORT MEMORY CELL

[75] Inventors: Bryan D. Sheffield, Allen; John David Drummond, Wylie, both of Tex.

[73] Assignee: Texas Instruments Incorporated, Dallas, Tex.

[21] Appl. No.: 685,642

[22] Filed: Jul. 26, 1996

[51] Int. Cl.⁶ .................................................. G11C 11/00
[52] U.S. Cl. .................. 365/154; 365/156; 365/230.05; 365/189.04
[58] Field of Search ................................ 365/154, 156, 365/189.04, 230.05

[56] References Cited

U.S. PATENT DOCUMENTS 5,420,813  5/1995  Nii .............................. 365/189.04
5,519,655  5/1996  Greenberg ..................... 365/189.02

OTHER PUBLICATIONS

Cheryl Ajluni, "Base Cell Design Spawns Advanced Arrays", Electronic Design, Sep. 19, 1994, pp. 178–179.

*Primary Examiner*—David C. Nelms
*Assistant Examiner*—Hoai Ho
*Attorney, Agent, or Firm*—Robby T. Holland; Richard L. Donaldson

[57]  ABSTRACT

A gate array structure includes a plurality of transistors (21–47) interconnected to form a two-bit memory cell. First and second interconnected transistors of the plurality are respectively provided in adjacent base sites (51, 53) of the gate array structure.

7 Claims, 2 Drawing Sheets

HIGH DENSITY TWO PORT MEMORY CELL

TECHNICAL FIELD OF THE INVENTION

The present invention relates generally to memory cell design and, more particularly, to a high density two port memory cell.

BACKGROUND OF THE INVENTION

FIG. 1 illustrates an example of a conventional two port memory cell. The example of FIG. 1 has been heretofore available in the TGC3000 gate array product sold by Texas Instruments, Incorporated. The memory cell of FIG. 1 provides a single two port SRAM bit whose implementation requires two gate array base sites in the TGC3000 gate array product. The gate widths in microns of the various transistors in FIG. 1 are shown therein. All of the exemplary transistors disclosed herein are assumed for purposes of explanation to have a 0.6 micron gate length.

The single two port memory bit of FIG. 1 is constructed using transistors from two adjacent gate array base sites in the TGC3000 gate array product. Thus, two gate array base sites are required for every bit of two port memory.

It is therefore desirable to provide a two port memory cell design having a higher bit density in terms of bit-to-base site ratio than the memory cell design of FIG. 1.

The present invention provides a two port memory cell design which has a higher bit-to-base site ratio than the prior art cell of FIG. 1.

DETAILED DESCRIPTION

Figures 1, 3:
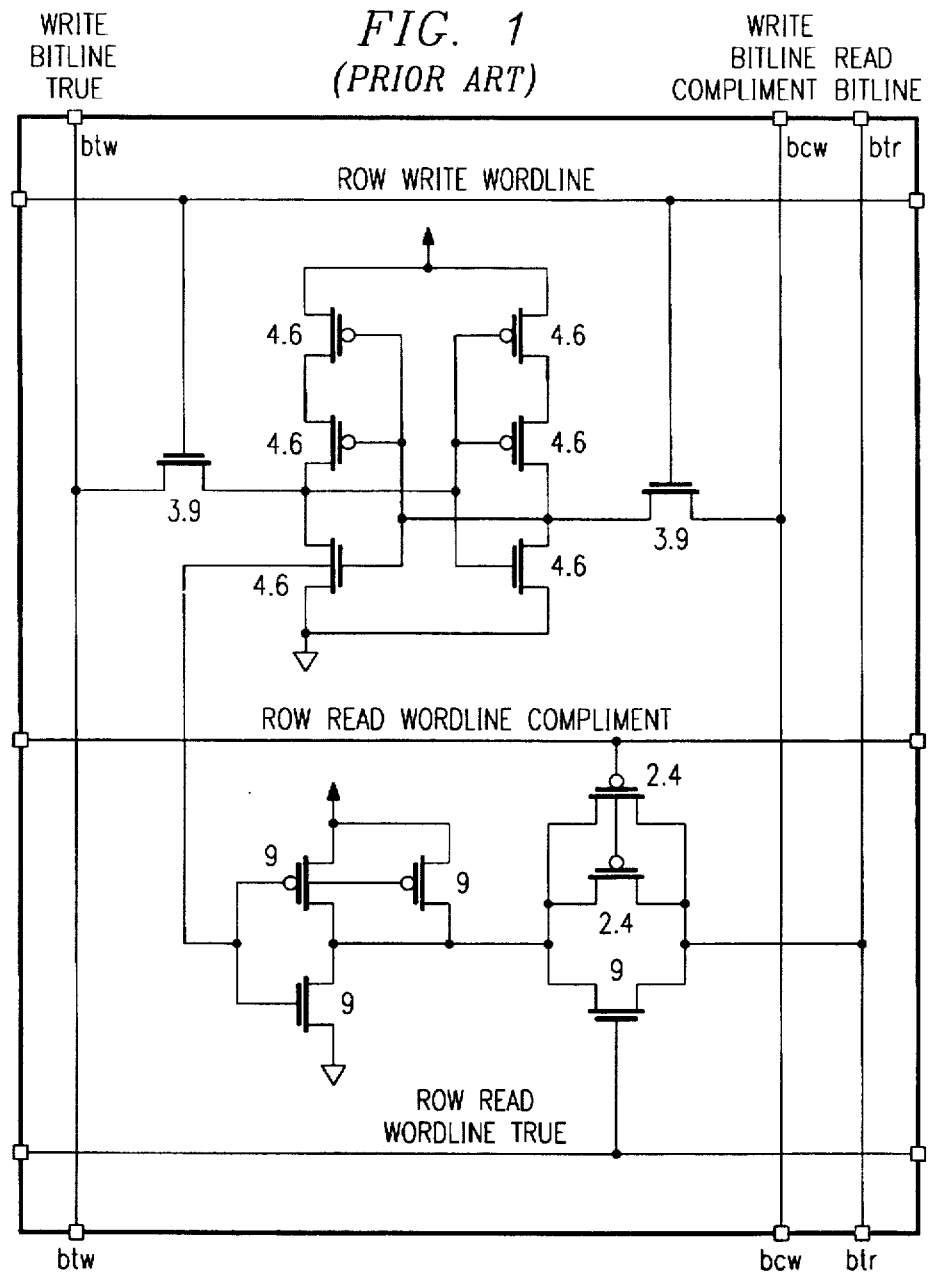
FIG. 1 illustrates a single two port memory bit as conventionally implemented with transistors from two adjacent gate array base sites.
FIG. 3 diagrammatically illustrates the two adjacent gate array base sites used in FIGS. 1 and 2.
Figure 2:
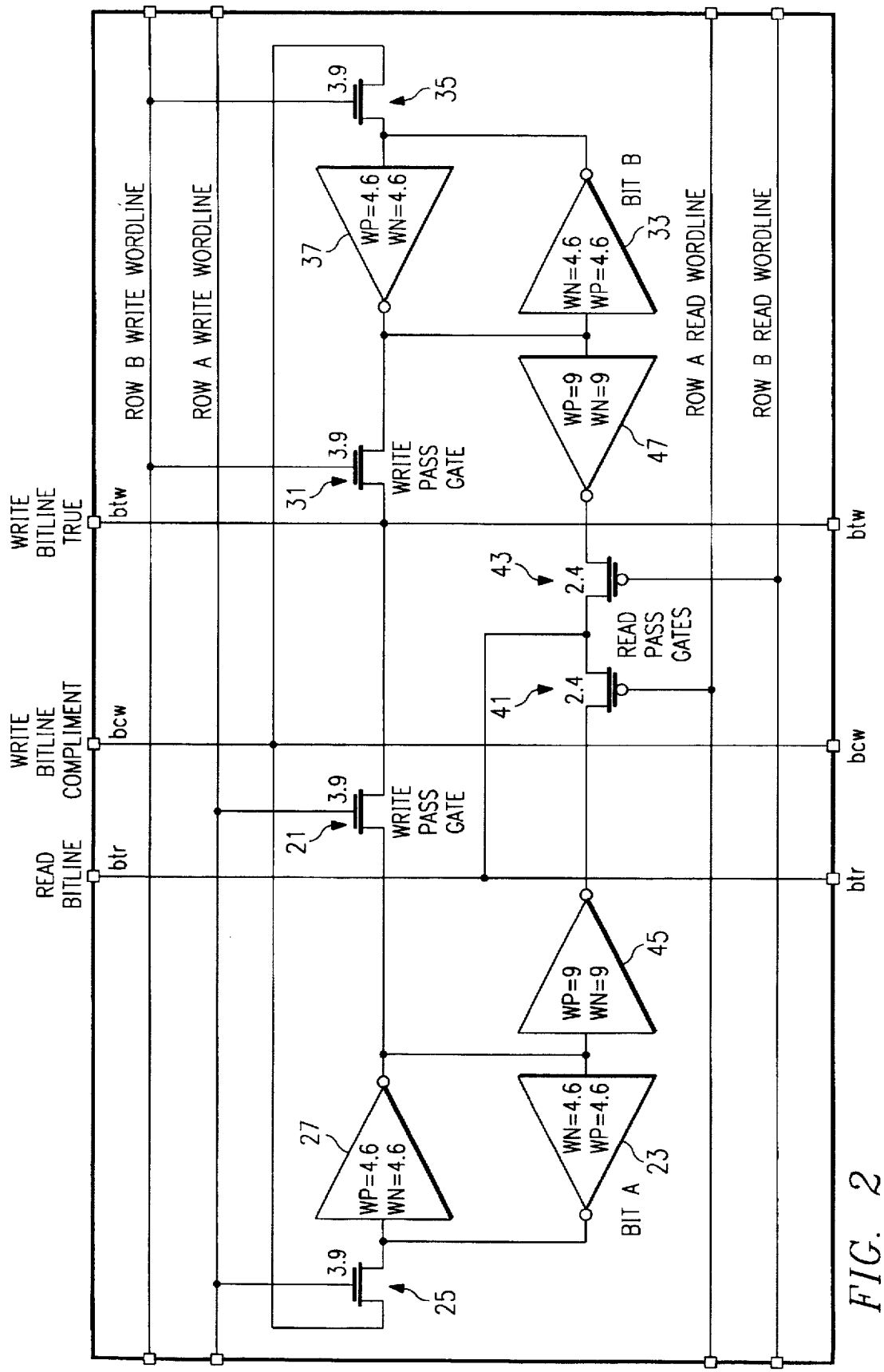
FIG. 2 illustrates a pair of two port memory bits realized according to the present invention using transistors from two adjacent gate array base sites.

Exemplary FIG. 2 illustrates a pair of two port SRAM bits realized according to the present invention using the transistors of two adjacent gate array base sites in the TGC3000 gate array product. The gate widths in microns of the transistors of FIG. 2 are shown therein. Although the inverters are shown diagrammatically in FIG. 2, the gate widths of their n-channel and p-channel transistors are respectively indicated by the symbols WN and WP. Comparison of FIGS. 1 and 2 reveals that all of the transistors of FIG. 1 are used in the design of FIG. 2, along with four additional n-channel transistors, two of the additional transistors having a 3.9 micron gate width and two of the additional transistors having a 4.6 micron gate width. The 18 transistors illustrated in FIG. 2 represent every available transistor in two adjacent gate array base sites of the TGC3000 gate array product. One of the adjacent base sites includes two n-channel transistors having a 9 micron gate width, two p-channel transistors having a 9 micron gate width, two n-channel transistors having a 3.9 micron gate width and two p-channel transistors having a 2.4 micron gate width, and the drains of the 2.4 micron p-channel transistors are connected together. The other of the adjacent base sites includes four p-channel transistors having a gate width of 4.6 microns, four n-channel transistors having a gate width of 4.6 microns, and two n-channel transistors having a gate width of 3.9 microns. The above-described adjacent base sites are illustrated at 51 and 53 in FIG. 3.

In FIG. 2, the row A write wordline controls data writes to bit A. When the row A write wordline is active high, the data on write bitline true is switched through the write pass gate 21 to the input of inverter 23, and the data on write bitline complement is switched through pass gate 25 to the input of inverter 27. Data on write bitline true and write bitline complement are similarly applied to inverters 33 and 37 of bit B via pass gates 31 and 35 when the row B write wordline is active high. Thus, write bitline true and write bitline complement are shared by bit A and bit B.

The aforementioned drain-connected 2.4 micron p-channel transistors serve as read pass gates 41 and 43 in FIG. 2. The connected drains of these pass gates are connected to a read bitline which is shared by both bit A and bit B. When the row A read wordline is active low, the output of inverter 45 drives the shared read bitline via pass gate 41. Similarly, when the row B read wordline is active low, the output of inverter 47 drives the shared read bitline via pass gate 43.

Because of the limited availability of transistors in the adjacent gate array base sites, the drain-connected 2.4 micron p-channel transistors are used as read pass gates 41 and 43 to drive the shared read bitline. The vertical direction routing is typically quite congested in gate array products such as the TCG3000, and the shared read bitline and shared write bitlines (true and complement) of FIG. 2 make it possible to provide two bits of memory which both advantageously use the same three vertical control paths that were used in the single bit cell of FIG. 1, namely btr (the read bitline), btw (the write bitline true) and bcw (the write bitline complement). Thus, the two bit memory cell of FIG. 2 is vertically similar to the single bit memory cell of FIG. 1 inasmuch as both designs are two gate array sites wide and have one vertical read bitline and one pair of vertical write bit lines. This permits the read and write column multiplexing circuitry associated with prior art FIG. 1 to be re-used with the design of FIG. 2, which reduces by at least 50 percent the layout work required to produce a memory array having the two bit memory cell structure of FIG. 2.

Horizontal direction routing in products such as the TCG3000 is typically less congested than vertical direction routing, so the row A read wordline and the row B read wordline are advantageously provided horizontally to select whether bit A or bit B controls the shared read bitline. The row A and row B read wordlines in combination with the pass gates 41 and 43 effectively provide a row-enable controlled built-in 2:1 multiplexer. It will be noted that the FIG. 2 cell includes only one more horizontal control line than the FIG. 1 cell.

The respective cross-coupled inverter pairs 23, 27 and 33, 37 of bits A and B are balanced for uniform operation and easier characterization. The read is buffered by inverters 45 and 47 so as not to affect write operation.

The exemplary memory design of FIG. 2 provides two bits of two port memory utilizing the same two adjacent gate array base sites as the single bit memory cell of FIG. 1. Thus, the memory design of FIG. 2 provides twice the bit density of the prior art design in FIG. 1.

Although an exemplary embodiment of the present invention is described above, this description does not limit the scope of the invention, which can be practiced in a variety of embodiments.

What is claimed is:

1. A memory cell which occupies adjacent base cites of a gate array comprising:

a first memory bit;

a second memory bit;

a read port shared by said first and second memory bits;

a first transistor directly connected between said first memory bit and said read port for providing a signal path from said first memory bit to said read port; and a second transistor directly connected between second memory bit and said read port for providing a signal path from said second memory bit to said read port.

2. The memory cell of claim 1, including a write port coupled to and shared by both of said memory bits.

3. The memory cell of claim 1, wherein said first and second transistors respectively include first and second control inputs, and including first and second enable lines respectively connected to said first and second control inputs.

4. The memory cell of claim 3, wherein said enable lines extend horizontally within the gate array.

5. The memory cell of claim 1, wherein said first and second memory bits each include a pair of cross-coupled inverters, and wherein said first and second memory bits each include a buffer connected between said cross-coupled inverters and the respective transistors.

6. The memory cell of claim 5, wherein said buffer is an inverter.

7. The memory cell of claim 5, wherein said read port includes a single node connected to both of said first and second transistors.

* * * * *